(12) United States Patent
Liu et al.

(10) Patent No.: US 9,589,626 B1
(45) Date of Patent: Mar. 7, 2017

(54) SINGLE-ENDED MEMORY SIGNAL EQUALIZATION AT POWER UP

(71) Applicant: Integrated Device Technology, Inc., San Jose, CA (US)

(72) Inventors: HaiQi Liu, Shanghai (CN); Yue Yu, Johns Creek, GA (US); Yumin Zhang, Shanghai (CN); Yi Xie, Shanghai (CN)

(73) Assignee: Integrated Device Technology, inc., San Jose, CA (US)

( * ) Notice: Subject to any disclaimer, the term of this patent is extended or adjusted under 35 U.S.C. 154(b) by 0 days.

(21) Appl. No.: 14/993,271

(22) Filed: Jan. 12, 2016

(30) Foreign Application Priority Data

Jan. 4, 2016 (CN) .......................... 2016 1 0003395

(51) Int. Cl.
 G11C 7/10 (2006.01)
 G11C 11/4074 (2006.01)
 G11C 11/4093 (2006.01)
 G11C 7/22 (2006.01)

(52) U.S. Cl.
 CPC ........ *G11C 11/4074* (2013.01); *G11C 7/1006* (2013.01); *G11C 7/1051* (2013.01); *G11C 7/1078* (2013.01); *G11C 7/22* (2013.01); *G11C 11/4093* (2013.01); *G11C 7/1072* (2013.01)

(58) Field of Classification Search
 CPC ....... G11C 7/1051; G11C 7/1078; G11C 7/22; G11C 7/1006; G11C 7/1072
 USPC .................................................... 365/189.05
 See application file for complete search history.

(56) References Cited

U.S. PATENT DOCUMENTS

| 9,183,166 B2* | 11/2015 | Shaeffer .............. G06F 13/1678 |
| 9,287,003 B2* | 3/2016 | Gopalakrishnan ... G11C 29/023 |
| 9,324,388 B2* | 4/2016 | Chinnakkonda Vidyapoornachary G11C 7/1072 |
| 2015/0363107 A1* | 12/2015 | Best ......................... G11O 5/04 711/105 |

OTHER PUBLICATIONS

Partovi, Hamid et al., "Single-Ended Transceiver Design Techniques for 5.33Gb/s Graphics Applications", 2009 IEEE International Solid-State Circuits Conference (ISSCC), Feb. 2009, pp. 136-138.

Bucher, Michael et al, "A 6.4-Gb/s Near-Ground Single-Ended Transceiver for Dual-Rank DIMM Memory Interface Systems", IEEE Journal of Solid-State Circuits, vol. 49, No. 1, Jan. 2014, pp. 127-139.

Song, Junyoung et al, "1V 10 Gb/s/pin Single-Ended Transceiver with Controllable Active-Inductor-Based Driver and Adaptively Calibrated Cascade-DFE for Post-LPDDR4 Interfaces", 2015 IEEE International Solid-State Circuits Conference (ISSCC), Feb. 2015, pp. 320-322.

\* cited by examiner

*Primary Examiner* — Pho M Luu
(74) *Attorney, Agent, or Firm* — Christopher P. Maiorana, P.C.

(57) ABSTRACT

An apparatus having a first circuit and a second circuit. The first circuit may be configured to buffer an input signal received as a single-ended signal from a data bus connected between a memory channel and a memory controller. The second circuit may be configured to condition the input signal relative to a reference voltage to generate a differential signal. The reference voltage may be isolated from the second circuit in response to a transition from a power down condition to a power on condition.

20 Claims, 6 Drawing Sheets

SINGLE-ENDED MEMORY SIGNAL EQUALIZATION AT POWER UP

This application relates to Chinese Application No. 201610003395.X, filed Jan. 4, 2016, which is hereby incorporated by reference in its entirety.

FIELD OF THE INVENTION

The invention relates to memory generally and, more particularly, to a method and/or apparatus for implementing single-ended memory signal equalization at power up.

BACKGROUND OF THE INVENTION

Random access memory (RAM) provides fast, cost-effective, volatile storage for computing devices. The Joint Electron Device Engineering Council (JEDEC) provides memory standards for storage devices. DDR4 SDRAM (double data rate fourth generation synchronous dynamic random-access memory) provides higher module density, lower voltage specifications and higher data rate transfer speeds. DDR4 LRDIMM (load reduced dual in-line memory module) technology uses a distributed buffer approach to implement memory bandwidth efficiencies when scaling to higher capacities and data rate transfer speeds.

With the advancement of DDR memory interfaces, the DDR4 memory currently operates at a data rate up to 3.2 gigabits per second. At such data rates, lossy characteristics and signal reflection in a data channel become significant where the received data eye is smaller than the transmitted waveform. Equalization at the receiver is used to compensate for the channel loss and reflection to recover the distorted data input to improve a receiver performance.

It would be desirable to implement single-ended memory signal equalization at power up.

SUMMARY OF THE INVENTION

The invention concerns an apparatus having a first circuit and a second circuit. The first circuit may be configured to buffer an input signal received as a single-ended signal from a data bus connected between a memory channel and a memory controller. The second circuit may be configured to condition the input signal relative to a reference voltage to generate a differential signal. The reference voltage may be isolated from the second circuit in response to a transition from a power down condition to a power on condition.

BRIEF DESCRIPTION OF THE DRAWINGS

Embodiments of the invention will be apparent from the following detailed description and the appended claims and drawings in which:

DETAILED DESCRIPTION OF THE PREFERRED EMBODIMENTS

Embodiments of the invention include providing a method and/or apparatus for single-ended memory signal equalization at power up that may (i) improve a stability of a reference voltage generation, (ii) reduce a disturbance in the reference voltage due to parasitic capacitance coupling upon exiting a power down condition, (iii) improve an accuracy of interpreting received waveforms, (iv) use different types of devices in input/output circuitry relative to a slicer circuit and/or (v) be implemented within an integrated circuit.

Various embodiments of the invention may provide a continuous-time linear equalizer (CTLE) circuit utilized to compensate for channel loss and reflection in multi-drop applications, such as memory interfaces to data busses. The CTLE circuit is generally designed such that exiting a power down condition (entering a power on condition) may cause minimal disturbance on a reference voltage. A delayed power down signal may be generated in response to a power down signal. A switch controlled by the delayed power down signal is generally inserted between the source of the reference voltage and the CTLE circuit. The design may also utilize a core voltage domain and core type devices in a slicer stage that may be faster than input/output (I/O) type devices operating at a higher I/O voltage domain.

Figure 1:
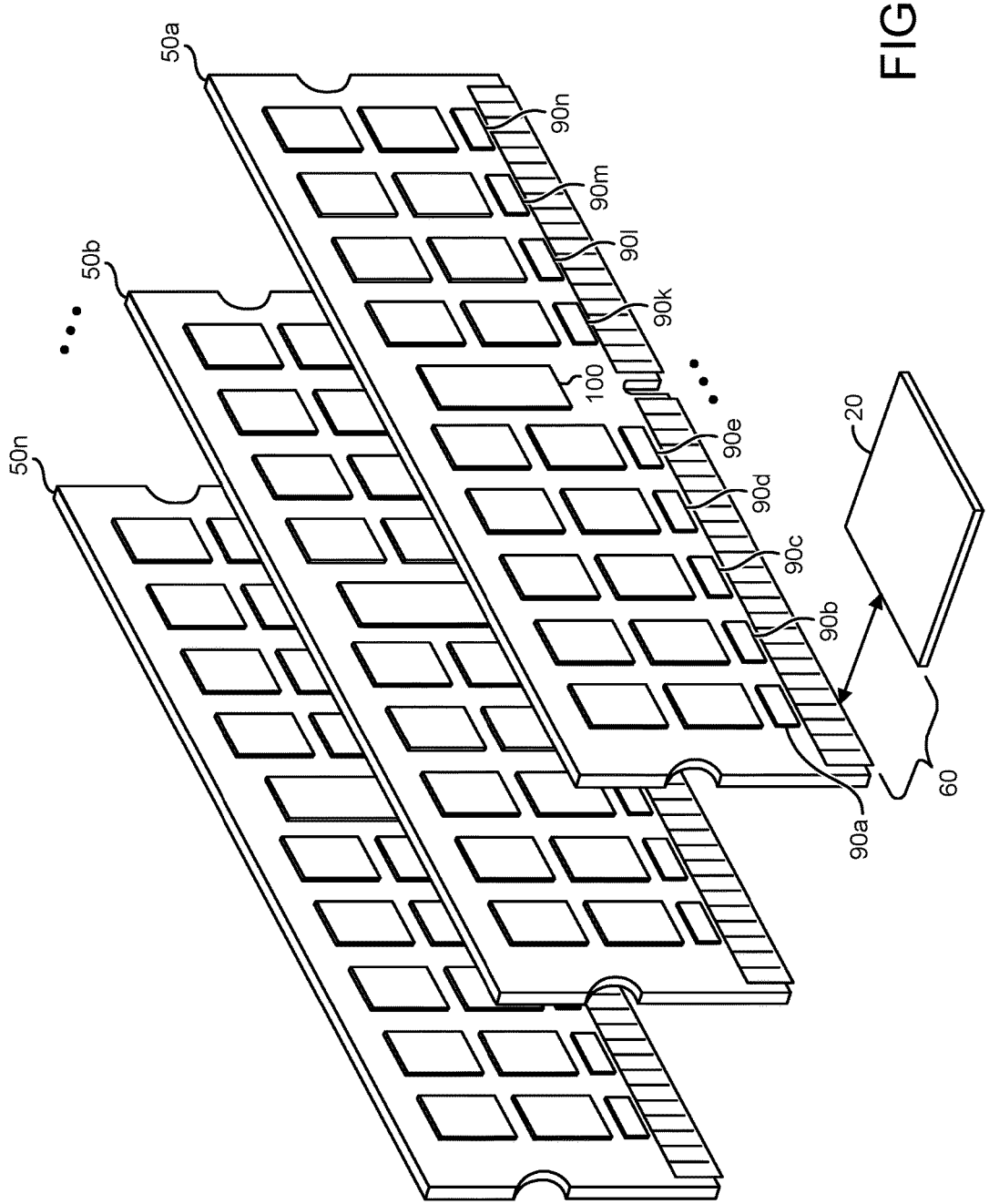
FIG. 1 is a diagram illustrating an example embodiment.

Referring to FIG. 1, a diagram illustrating a number of example circuits 50a-50n are shown. In an example, circuits 50a-50n may be implemented as memory modules (or boards). For example, the memory modules 50a-50n may be implemented as double data rate fourth generation (DDR4) synchronous dynamic random-access memory (SDRAM) modules. The memory modules 50a-50n may comprise a number of blocks (or circuits) 90a-90n, a block (or circuit) 100, and/or various other blocks, circuits, pins, connectors and/or traces. The circuits 90a-90n may be configured as data buffers. The circuit 100 may be implemented as a registered clock driver (RCD). In an example, the RCD circuit 100 may be implemented as a DDR4 RCD circuit. The type, arrangement and/or number of components of the memory modules 50a-50n may be varied to meet the design criteria of a particular implementation.

The memory modules 50a-50n are shown connected to a block (or circuit) 20. The circuit 20 may be a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard. In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to a computer motherboard (e.g., by pins, traces and/or connectors 60) to transfer data between components of a computing device and the memory modules 50a-50n. In an example, the memory controller 20 may be implemented on a northbridge of a motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the memory modules 50a-50n may be DDR4 SDRAM memory modules. The DDR4 SDRAM memory modules 50a-50n may have a memory module density of 512 gigabyte (GB), terabyte, or higher per module (e.g., compared to 128 GB per dual in-line memory module (DIMM) in DDR3). The DDR4 SDRAM memory modules 50a-50n may operate at voltages of 1.2-1.35 volts (V) with a frequency between 800-2133 megahertz (MHZ) (e.g., compared to 1.5-1.65V at frequencies between 400-1067 MHz in DDR3). In some embodiments, the memory modules 50a-50n may be implemented as low voltage DDR4 and operate at 1.05V. For example, the DDR4 SDRAM memory modules 50a-50n may implement 35% power savings compared to DDR3 memory. The DDR4 SDRAM memory modules 50a-50n may transfer data at speeds of 2.13-4.26 giga-transfers per second (GT/s) and higher (e.g., compared to 0.8-2.13 GT/s in DDR3). The operating parameters of the memory modules 50a-50n may be varied according to the design criteria of a particular implementation.

In an example, the memory modules 50a-50n may compliant with the DDR4 specification titled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 50a-50n may be implemented as DDR4 load reduced DIMM (LRDIMM) or DDR4 registered DIMM (RDIMM). The data buffers 90a-90n may allow the memory modules 50a-50n in a DDR4 LRDIMM configuration to operate at higher bandwidth and/or at higher capacities compared to DDR4 RDIMM (e.g., 1333 MT/s for DDR4 LRDIMM compared to 1067 MT/s for DDR4 RDIMM at 384 GB capacity). For example, compared to DDR4 RDIMM configurations, the DDR4 LRDIMM configuration of the memory modules 50a-50n may allow improved signal integrity on data signals, lower component latency through the data buffers 90a-90n and/or better intelligence and/or post-buffer awareness by the memory controller 20.

Figure 2:
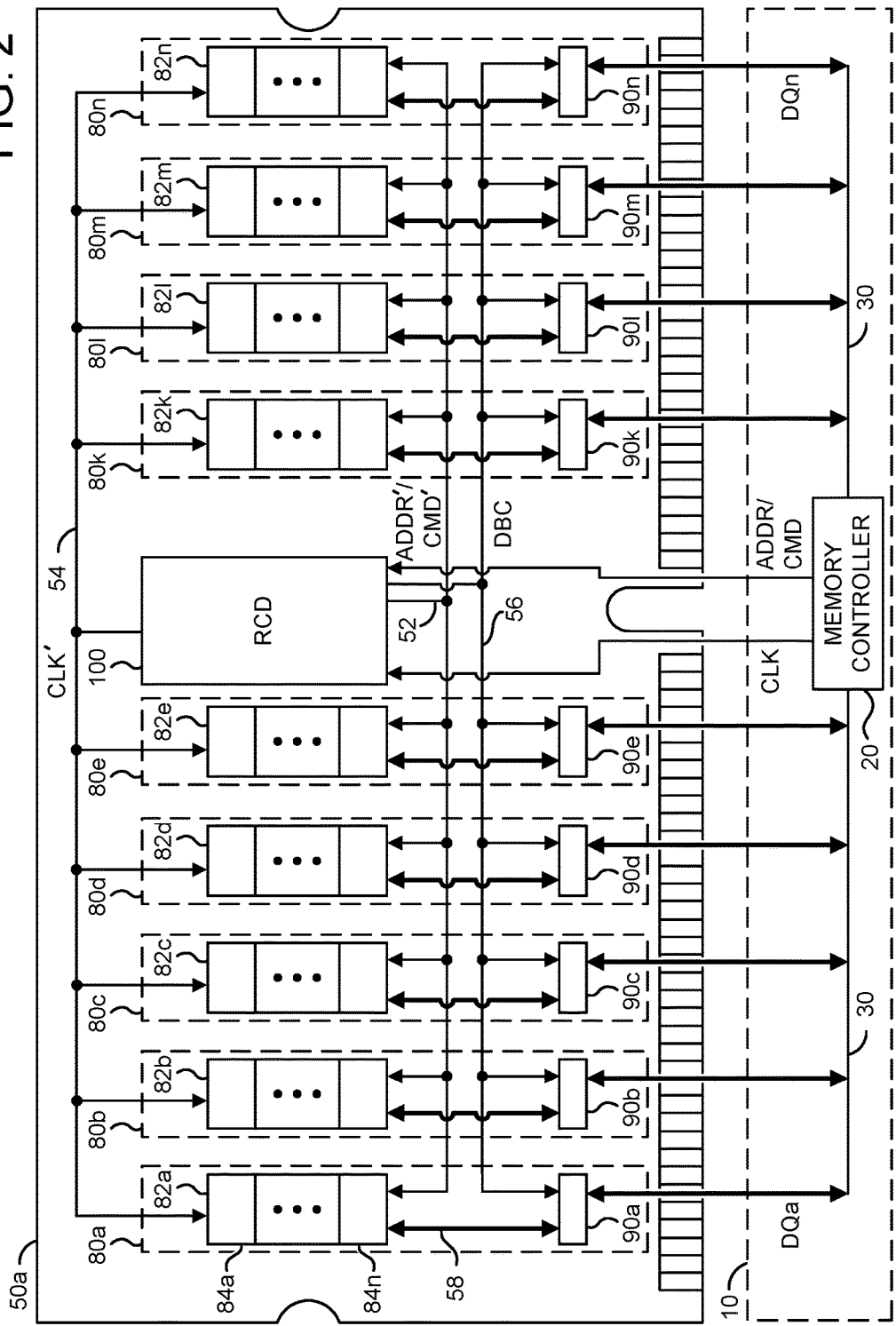
FIG. 2 is a block diagram illustrating a memory module.

Referring to FIG. 2, a block diagram 50a illustrating a memory module is shown. The memory module 50a may be representative of the memory modules 50b-50n. The memory module 50a is shown communicating with the memory controller 20. The memory controller 20 is shown as part of a block (or circuit) 10. The circuit 10 may be a motherboard, or other electronic component or computing engine that communicates with the memory module 50a.

The memory module 50a may comprise one or more blocks (or circuits) 80a-80n and/or the RCD circuit 100. The circuits 80a-80n may implement data paths of the memory module 50a. For example, the data path 80a may include the blocks 82a and/or the data buffer 90a. The data paths 80b-80n may have a similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 100. A data bus 30 may be connected between the memory controller 20 and the data paths 80a-80n. The memory controller 20 may generate and/or receive data signals (e.g., DQa-DQn) that may be presented/received from the data bus 30. The signals DQa-DQn may be presented to each of the data paths 80a-80n.

The RCD circuit 100 may be configured to communicate with the memory controller 20, the memory channels 82a-82n and/or the data buffers 90a-90n. The RCD circuit 100 may decode instructions received from the memory controller 20. For example, the RCD circuit 100 may receive register command words (RCWs). In another example, the RCD circuit 100 may receive buffer control words (BCWs). The RCD circuit 100 may be configured to train the DRAM chips 84a-84n, the data buffers 90a-90n and/or command and address lines between the memory controller 20. For example, the RCWs may flow from the memory controller 20 to the RCD circuit 100. The RCWs may be used to configure the RCD circuit 100.

The RCD circuit 100 may be used in both LRDIMM and RDIMM configurations. The RCD circuit 100 may implement a 32-bit 1:2 command/address register. The RCD circuit 100 may support an at-speed bus (e.g., a BCOM bus between the RCD circuit 100 and the data buffers 90a-90n). The RCD circuit 100 may implement automatic impedance calibration. The RCD circuit 100 may implement command/address parity checking. The RCD circuit 100 may control register RCW readback. The RCD circuit 100 may implement a 1 MHz inter-integrated circuit ($I^2C$) bus (e.g., a serial bus). Inputs to the RCD circuit 100 may be pseudo-differential using external and/or internal voltages. The clock outputs, command/address outputs, control outputs and/or data buffer control outputs of the RCD circuit 100 may be enabled in groups and independently driven with different strengths.

The RCD circuit 100 may receive the signal CLK and/or the signals ADDR/CMD from the memory controller 20. Various digital logic components of the ROD circuit 100 may be used to generate signals based on the signal CLK and/or the signals ADDR/CMD and/or other signals (e.g., RCWs). The RCD circuit 100 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals CLK' and/or ADDR'/CMD' may be transmitted on a common bus 54. The RCD circuit 100 may generate one or more signals (e.g., DBC). The signals DBC may be presented to the data buffers 90a-90n. The signals DBC may be transmitted on a common bus 56 (e.g., a data buffer control bus).

The data buffers 90a-90n may be configured to receive data from the bus 56. The data buffers 90a-90n may be configured to generate/receive data to/from the bus 30. The bus 30 may comprise traces, pins and/or connections between the memory controller 20 and the data buffers 90a-90n. A bus 58 may carry the data between the data buffers 90a-90n and the memory channels 82a-82n. The data buffers 90a-90n may be configured to buffer data on the buses 30 and 58 for write operations (e.g., data transfers from the memory controller 20 to the corresponding memory channels 82a-82n). The data buffers 90a-90n may be configured to buffer data on the buses 30 and 58 for read operations (e.g., data transfers from the corresponding memory channels 82a-82n to the memory controller 20).

The data buffers 90a-90n may exchange data with the DRAM chips 84a-84n in small units (e.g., 4-bit nibbles). In various embodiments, the DRAM chips 84a-84n may be arranged in multiple (e.g., two) sets. For two set/two DRAM chip 84a-84b implementations, each set may contain a single DRAM chips 84a-84n. Each DRAM chip 84A-84b may be connected to the respective data buffers 90a-90n through an upper nibble and a lower nibble. For two set/four DRAM chip 84a-84d implementations, each set may contain two DRAM chips 84a-84d. A set may be connected to the respective data buffers 90a-90n through the upper nibble. The other set may be connected to the respective data buffers 90a-90n through the lower nibble. For two set/eight DRAM chip 84a-84h implementations, each set may contain four of the DRAM chips 84a-84h. A set of four DRAM chips 84a-84d may connect to the respective data buffers 90a-90n through the upper nibble. The other set of four DRAM chips 84e-84h may connect to the respective data buffers 90a-90n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 90a-90n may allow DDR4 LRDIMM designs to implement shorter I/O trace lengths compared to DDR3 LRDIMM designs, that use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), that is 50% less latency than DDR3 buffer memory). In yet another example, the shorter traces may reduce I/O bus turnaround time. For example, without the distributed data buffers 90a-90n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 90a-90n. The memory modules 50a-50n may implement 2 millimeter (mm) frontside bus traces and backside traces (e.g., the connectors/pins/traces 60). A propagation delay through the data buffers 90a-90n may be 33% faster than through a DDR3 memory buffer (e.g., resulting in reduced latency). In some embodiments, the data buffers 90a-90n may be smaller (e.g., a reduced area parameter) than a data buffer used for DDR3 applications.

Figure 3:
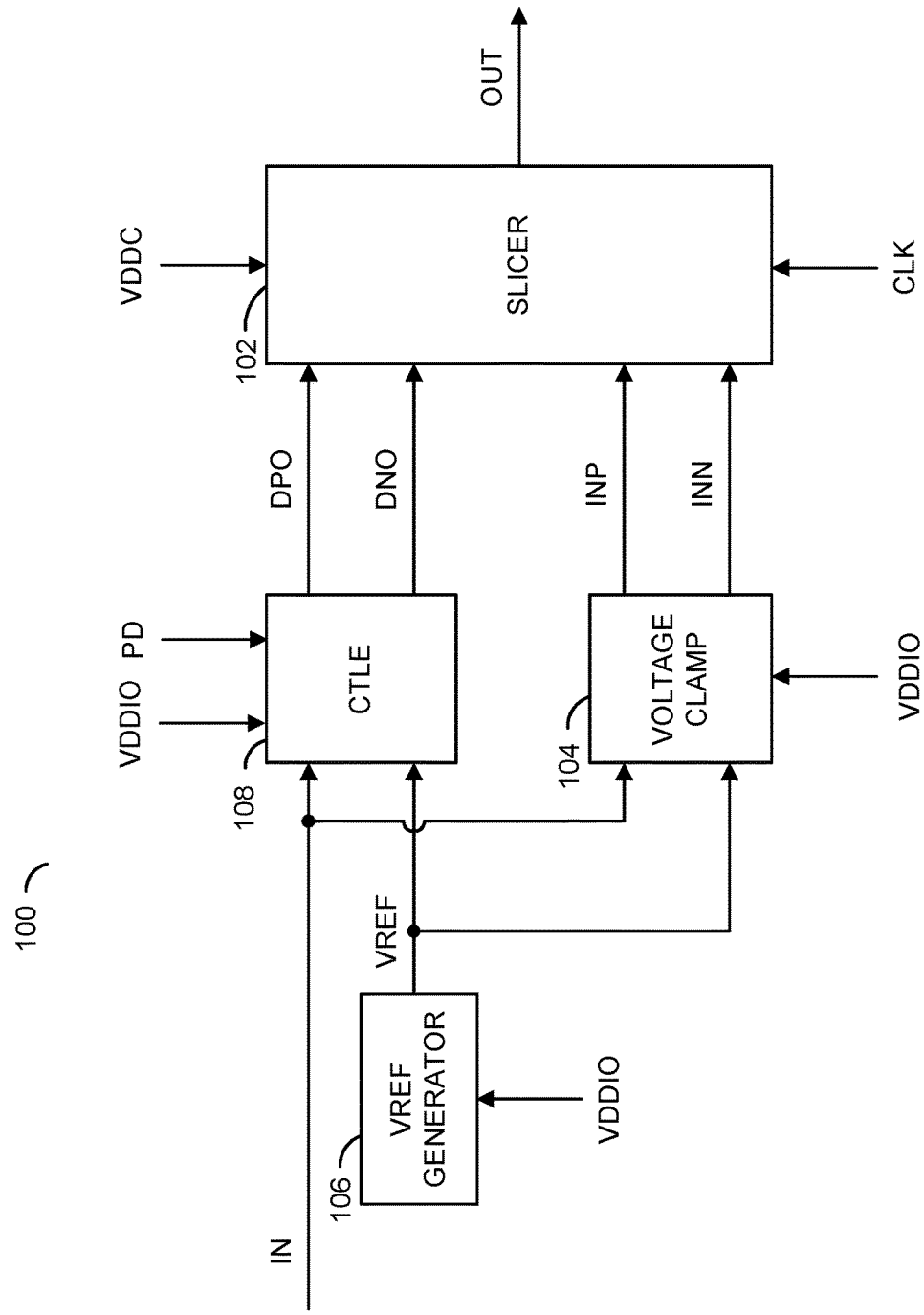
FIG. 3 is a diagram of a receiver portion of an RCD circuit.

Referring to FIG. 3, a diagram of an example implementation of the receiver portion of the RCD circuit 100 is shown. The receiver portion generally comprises a slicer block (or circuit) 102, a voltage clamp block (or circuit) 104, a reference voltage generator block (or circuit) 106 and a CTLE block (or circuit) 108. The CTLE circuit 108 is generally inserted between an incoming data signal (e.g., IN) and the sampling slicer circuit 102. In various embodiments, the signal IN may represent any of the commands in the signal CMD, the addresses in the signal ADDR and/or other information transferred from the memory controller 20 to the RCD circuit 100.

The slicer circuit 102 may be operational to convert differential signals (e.g., DPO and DNO) into a single-ended signal (e.g., OUT). The signal OUT may carry a shaped version of the information received in the differential signals DPO and DNO. The shaping generally retains level portions of the information that represent nominal values of the information in intervals between consecutive transitions. The slicer circuit 102 may be implemented with core transistors (e.g., NMOS transistors) as input devices to achieve a small set-up time and ck-q delay. Voltage levels in the differential signals DPO and DNO generated by the CTLE circuit 108 generally do not exceed a maximum operating voltage of the core transistors in the slicer circuit 102.

The voltage clamp circuit 104 may be operational to clamp (or limit) the voltages in the signal IN. The voltage clamp circuit 104 generally comprises a core transistor configured as a transmission gate, and a voltage generator with an output capability at a fraction (e.g., around 14/16ths) of an input/output voltage (or power) domain VDDIO (e.g., 1.2 volts). The generated output voltage may be connected to a gate of the core transistor so that regardless how high the voltage in the signal IN becomes, the voltage clamp circuit 104 may limit the input voltage in a differential signal (e.g., INP, INN) to the fraction of VDDIO to protect the slicer circuit 102. In some embodiments, the voltage clamp circuit 104 may be implemented with core transistors working in an input/output voltage domain VDDIO.

The reference voltage generator circuit 106 may be operational to provide a fixed reference voltage in the signal VREF to multiple (e.g., up to 33) copies of the CTLE circuit 108. In some embodiments, the signal VREF may be generated as a fraction (e.g., half) of the input/output voltage domain VDDIO. Other reference voltages may be generated to meet the design criteria of a particular implementation. In various embodiments, multiple instantiations of the reference voltage generator circuit 106 may be implemented based on the number of CTLE circuits 108 that consume the signal VREF.

The CTLE circuit 108 may be configured to improve a data eye height and improve width shmoo results for the information in the signal IN. Because the information in the signal IN and the reference voltage signal VREF comes from the input/output voltage domain VDDIO, the CTLE circuit 108 is generally placed under the input/output voltage domain VDDIO. The CTLE circuit 108 may use relatively slower input/output transistors relative to a core voltage domain VDDC (e.g., 0.9 volts). Due to timing criteria, relatively faster core transistors powered by the lower core voltage domain VDDC may be used in the slicer circuit 102. The CTLE circuit 108 is generally configured to create a suitable voltage swing in the differential signals DPO and DNO for the slicer circuit 102.

Figure 4:
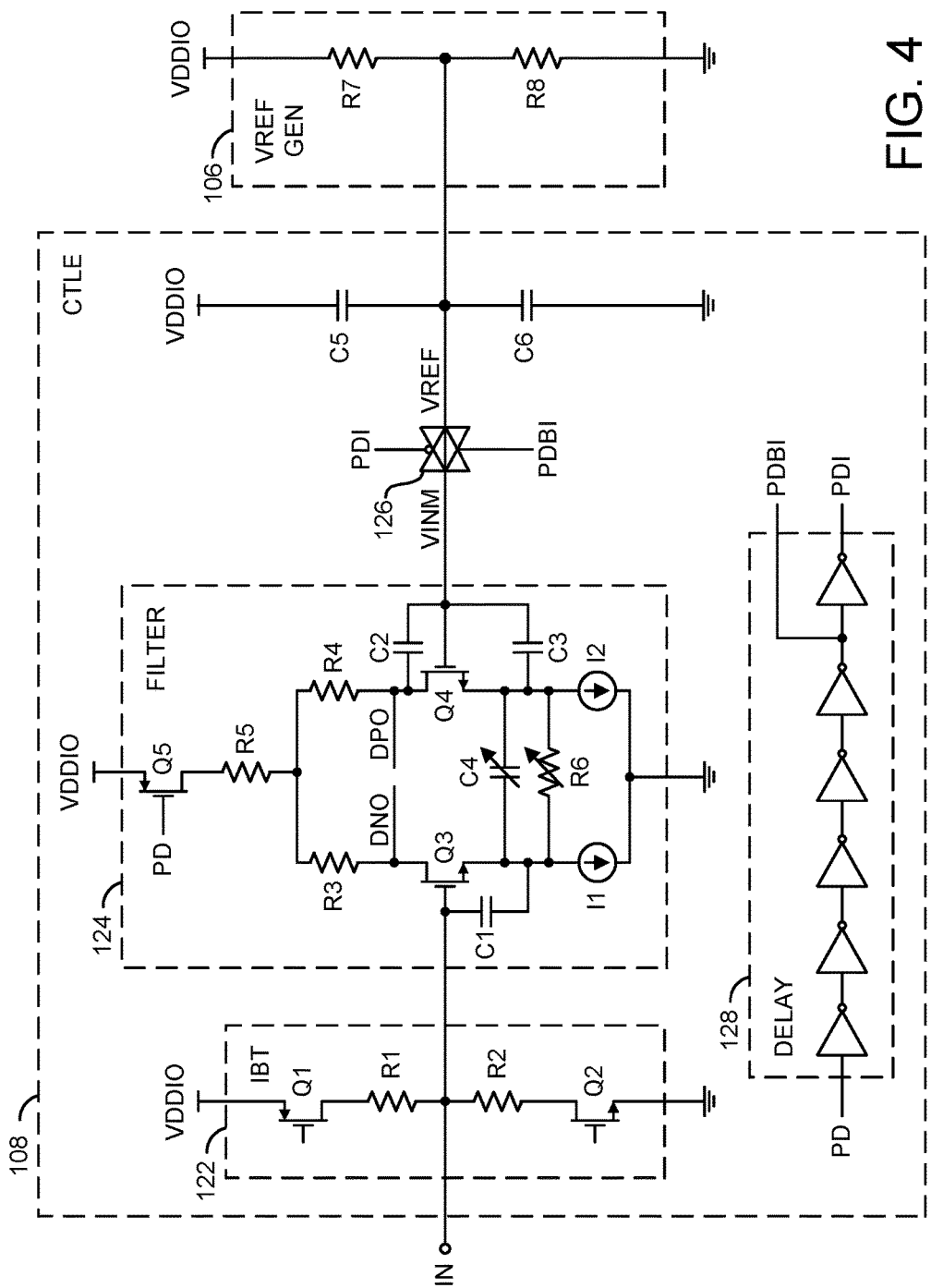
FIG. 4 is a schematic of a CTLE circuit.

Referring to FIG. 4, a schematic of an example implementation of the CTLE circuit 108 and the reference voltage generator circuit 106 is shown. The CTLE circuit 108 generally comprises a termination circuit 122, a filter circuit 124, a switch circuit 126 and a delay circuit 128. The termination circuit 122 and the filter circuit 124 may receive the input signal IN. The reference voltage signal VREF may be transferred from the reference voltage generator circuit 106 to the switch circuit 126. A gate voltage (e.g., VINM) may be generated by the switch circuit 126 and transferred to the filter circuit 124. A power down (or power control) signal (e.g., PD) may be received by the delay circuit 128 from logic within the RCD circuit 100. The delay circuit 128 may generate differential delayed signals (e.g., PDI and PDBI) that are transferred to the switch circuit 126. The filter circuit 124 may generate the differential signals DPO and DNO.

The reference voltage generator circuit 106 may be implemented as a resistor divider circuit with resistors R7 and R8. The resistor divider generally supplies the reference voltage in the signal VREF for multiple CTLE circuits 108. Other types of reference voltage generators may be implemented to meet the design criteria of a particular application.

The termination circuit 122 may implement an Input Bus Termination (IBT) buffer circuit for each input signal IN. The IBT circuit 122 may be implemented as a resistor divider, with an effective impedance of several hundred (e.g., 200) ohms to VDDIO and several hundred (e.g., 200 ohms) to ground (e.g., VSS), respectively, for termination of the signal IN. The IBT circuit 122 generally comprises a resistor R1 and a transistor Q1 in series between VDDIO and a central node, and a resistor R2 and a transistor Q2 in series between VSS and the central node.

The filter circuit 124 may implement a CTLE filter circuit. The circuit 124 generally forms an amplifier comprising a pair of transistors Q3 and Q4 and a pair of respective current sources I1 and I2 in parallel paths. Load resistors R3 and R4 may be connected to the transistors Q3 and Q4, respectively. A resistor R5 and transistor Q5 may provide common mode power to the load resistors R3 and R4. The common mode resistor R5 and transistor Q5 generally lowers an upper voltage of the differential signals DPO and DNO to an appropriate range for slicer circuit 102. A capacitor C4 and a resistor R6 may be connected in parallel between the current sources I1 and I2 to set a frequency characteristic of the filter circuit 124. In various embodiments, the filter circuit 124 may function as a negative impedance converter (NIC). A capacitor C1 may be connected between the gate and source of the transistor Q3. Parasitic capacitors C2 and C3 may be formed about the drain, gate and source of the transistor Q4.

In an example, the conditioning performed by the filter circuit 124 may boost high frequency components of the differential signals DPO and DNO relative to lower frequency components. A particular amount of crosstalk (e.g., noise) between the signal DPO and the signal DNO may present a practical limit the amount of boosting that may be applied. The filter circuit 124 may increase an amount of the amplitude of the differential signals DPO and DNO. The amplitude may be increased without an increase in an amount of crosstalk and/or reflections (e.g., noise).

The switch circuit 126 may implement a transmission (or pass) gate. The switch circuit 126 generally comprises a pair of CMOS transistors connected in parallel. The signal PDI may be received by one of the transistors and the signal PDBI may be received by the other transistor. When activated (e.g., switching on) by the signals PDI and PDBI, the switch circuit 126 may couple the signal VREF to the signal VINM. When deactivated (e.g., switched off), the switch circuit 126 may provide a high impedance between the signal VREF and the signal VINM to prevent the parasitic capacitors C2 and/or C3 from driving the signal VREF to an improper voltage. In order to track the noise coupled from the VDDIO supply to the data input through the termination circuit 122 at the reference voltage side, two capacitors C5 and C6 may be implemented to replicate a coupling effect from the input/output voltage domain VDDIO at a mid-frequency range.

The switch circuit 126 generally solves the coupling effect on the signal VREF upon exiting power down. In conventional CTLE designs without the switch circuit 126, when the CTLE circuit is in a power down condition (or status), all the internal nodes may be pulled to a ground level. When exiting power down, the voltages at the internal nodes start to rise. Due to the parasitic capacitances (e.g., the capacitors C2 and/or C3) from multiple CTLE circuits 108, a strong coupling to the signal VREF may be generated. The coupling may cause the signal VREF to shift away from an ideal (e.g., VDDIO/2) value. The coupling effect generally takes tens of nanoseconds to fade away. During the fade, data input comparisons with an improper voltage in the signal VREF may cause wrong data sampling before the coupling effect is gone.

The delay circuit 128 may implement multiple (e.g., 4-8 copies) delay stages (e.g., invertors) connected in series. The intermediate signal PDI may be generated by a last stage in the series. The signal PD may be received by an initial stage. The intermediate signal PDBI may be generated by a second to last stage in the series. Other types of delay circuits may be implemented to meet the design criteria of a particular application.

When exiting power down, a gate voltage in the signal VINM generally follows a rise of the internal nodes of the filter circuit 124 because the gate of the transistor Q4 is floating. After a short delay, when the internal nodes and the voltage in the signal VINM are close to final stable voltages, the signals PDI and PDBI may activate (e.g., close) the switch circuit 126 and connect the signal VINM and the signal VREF. The delayed coupling effect imposed on the signal VREF may be reduced to a negligible amount.

Figure 5:
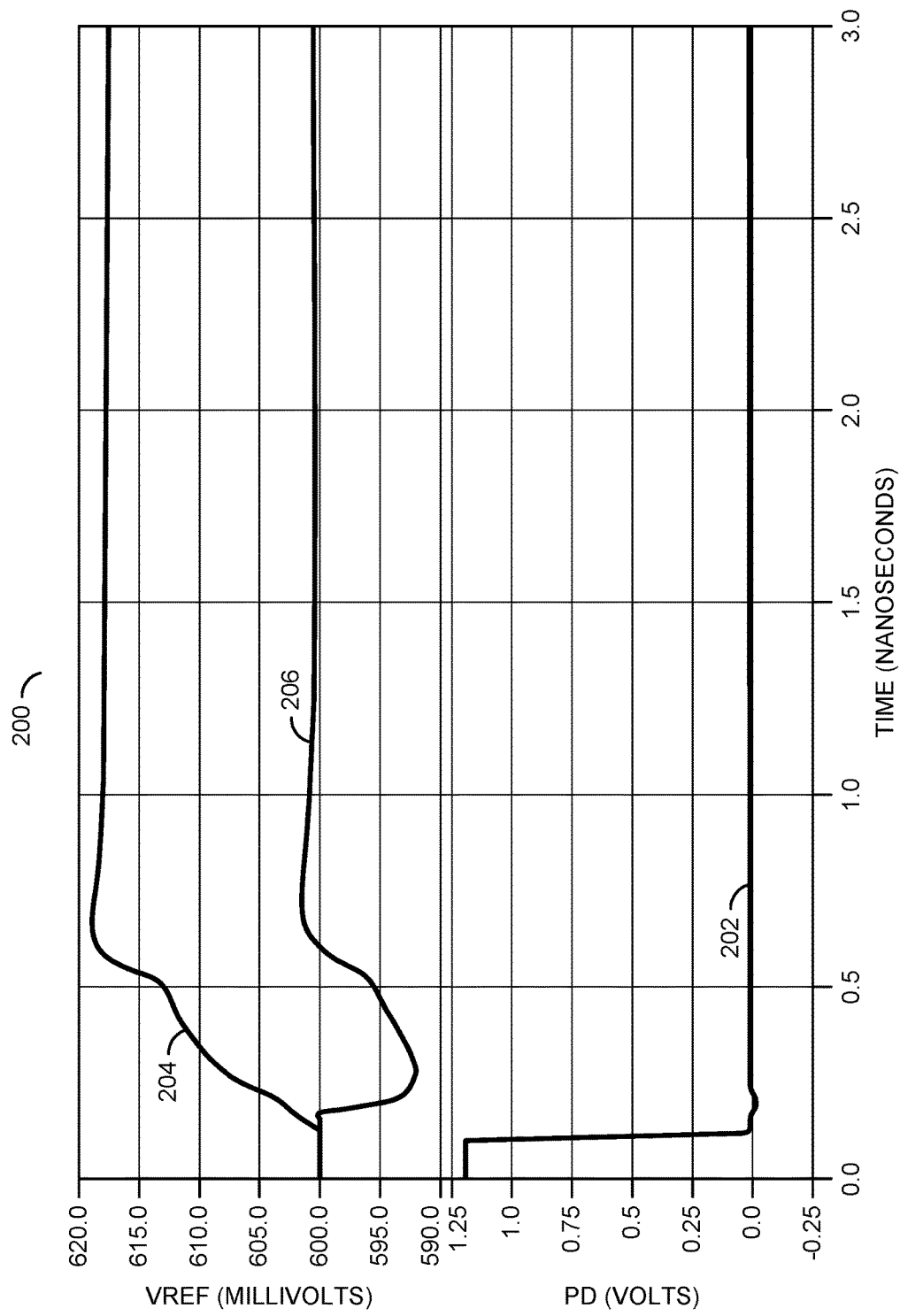
FIG. 5 is a graph illustrating a comparison of coupling effect into the signal VREF upon power down exit.

Referring to FIG. 5, a graph illustrating a simulated comparison of coupling effect into the signal VREF upon exiting power down is shown. A curve 202 may represent the low-active power down signal PD. A curve 204 generally shows the signal VREF of a common CTLE circuit without the switch circuit 126. As illustrated by the curve 204, a significant (e.g., approximately a 17 millivolt) upward shift of the signal VREF is created by the common CTLE circuits upon exiting power down. The voltage shift may fall back to the original voltage (e.g., 600 millivolts) at slow speed due to the strong coupling effect. A curve 206 generally shows the signal VREF coupled to the CTLE circuit 108 after the delay. In the curve 206, a small ripple (e.g., around 8 millivolts) may be seen for a few nanoseconds after the signal PD transitions from a power down condition (e.g., 1.2 volts) to a power up condition (e.g., zero volts). The ripple generally diminishes quickly (e.g., within 1 nanosecond) and so may not affect any subsequent data/reference voltage comparisons and decisions.

Figure 6:
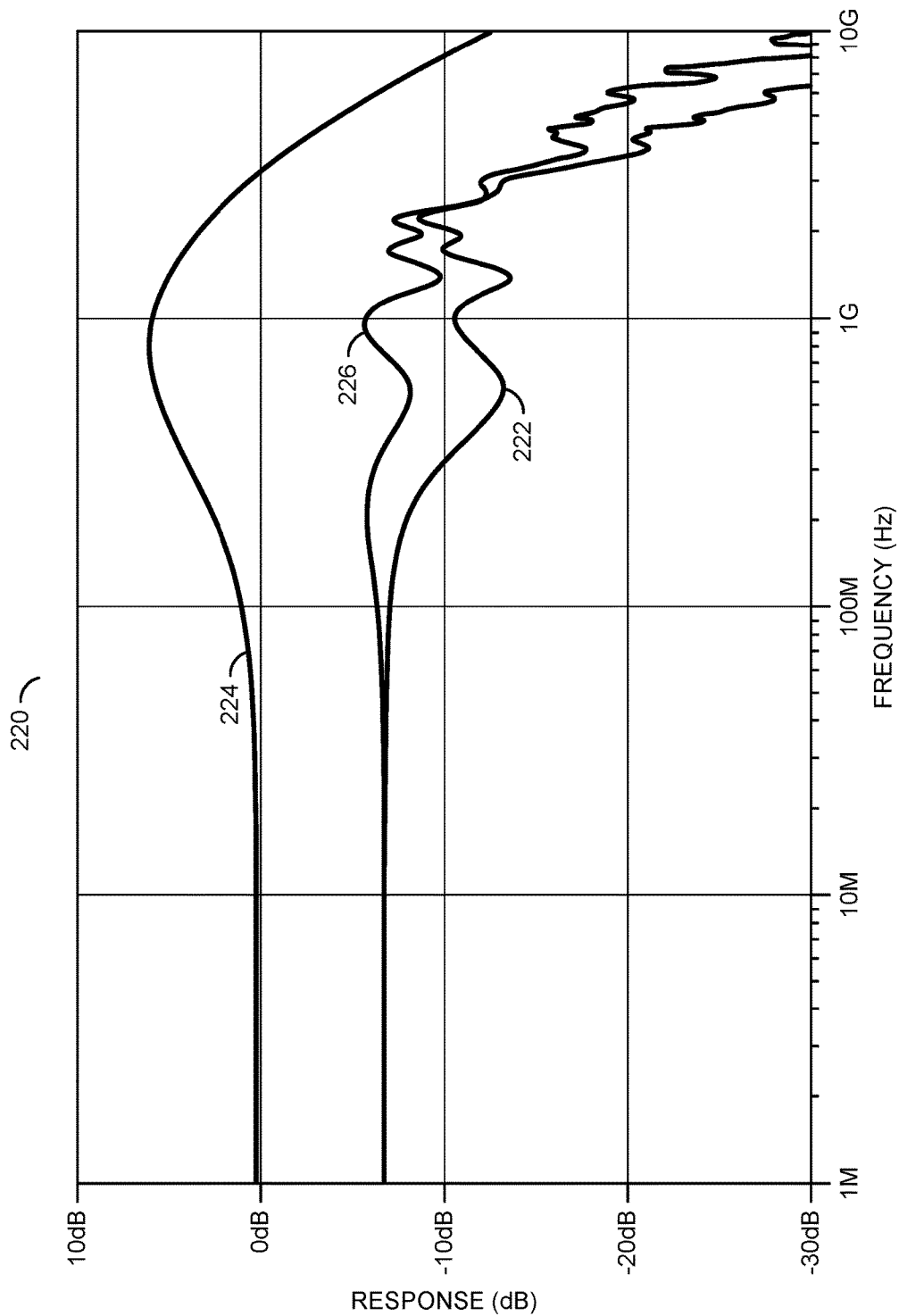
FIG. 6 is a graph illustrating an AC response of the CTLE circuit, a channel and the channel with the CTLE circuit.

Referring to FIG. 6, a graph illustrating an AC response of the CTLE circuit 108, a communication channel, and the communication channel with the CTLE circuit 108 is shown. A curve 222 may illustrate a channel response. A curve 224 generally illustrates a response of the CTLE circuit 108. A curve 226 may illustrate a response of the channel and the CTLE circuit 108.

The CTLE circuit 108 generally achieves a high frequency boosting relative to a low frequency gain, as shown in the curve 224. The boosting may compensate to some extent for channel loss and reflections at a frequency of interest. The compensation generally reduces signal distortion due to an insertion loss and a return loss of the channel.

For example, at a DDR data rate of 2,400 megabits per second, the frequency of interest may be around 600 megahertz (MHZ) where the curve 222 has a valley. At the frequency of interest, the channel curve 222 generally shows a loss of approximately 6.4 dB as compared with a DC gain. With the equalization of the CTLE circuit 108 taken into account, the loss may be reduced (e.g., around a 1 dB loss), as shown in the curve 226.

In various embodiments, the slicer circuit 102 may be designed to operate in the input/output voltage domain VDDIO with input/output devices for comparability with the signals received from the filter circuit 124. In some embodiments, the filter circuit 124 may be designed to operate in the core voltage domain VDDC to generate lower voltage signals. Other combinations of the core devices, the core voltage domain VDDC, the input/output devices and the input/output voltage domain VDDIO may be implemented to meet the design criteria of a particular application.

While FIG. 3 shows the CTLE circuit 108 in the context of the RCD circuit 100 while receiving information, copies of the CTLE circuit 108 may be implemented at other locations, other data paths and/or other control paths. In some embodiments, copies of the CTLE circuits 108 may be located in the data buffer circuits 90a-90n to improve the signals received from the memory controller 20 during write cycles. In various embodiments, copies of the CTLE circuits 108 may be located at the other end of the data bus 30 to improve various signals generated by the memory modules 50a-50n and received by the memory controller 20. For example, the memory controller 20 may include copies of the CTLE circuits 108 to equalize the read data sent in the signals DQa-DQn from the memory modules 50a-50n during a read cycle. Instances of the CTLE circuits 108 may also be implemented in other circuitry within the memory modules 50a-50n.

The functions and structures illustrated in the diagrams of FIGS. 1 to 4 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

While the invention has been particularly shown and described with reference to the preferred embodiments thereof, it will be understood by those skilled in the art that various changes in form and details may be made without departing from the scope of the invention.

The invention claimed is:

1. An apparatus comprising:
    a first circuit configured to buffer an input signal received as a single-ended signal from a data bus connected between a memory channel and a memory controller; and
    a second circuit configured to equalize said input signal relative to a reference voltage to generate a differential signal, wherein said reference voltage is isolated from said second circuit in response to a transition from a power down condition to a power on condition.

2. The apparatus according to claim 1, wherein said reference voltage is connected to said second circuit after a predetermined time.

3. The apparatus according to claim 1, further comprising a switch configured to alternatively isolate and connect said reference voltage to said second circuit in response to a power control signal.

4. The apparatus according to claim 3, wherein said switch is a pass gate comprising two parallel transistors.

5. The apparatus according to claim 1, wherein (i) said second circuit further comprises a delay circuit configured to delay a power control signal to generate an intermediate signal and (ii) said isolation of said reference voltage from said second circuit is controlled by said intermediate signal.

6. The apparatus according to claim 5, wherein said delay circuit comprises a plurality of delay stages connected in series.

7. The apparatus according to claim 1, wherein said transition from said power down condition to said power on condition is in response to a power control signal.

8. The apparatus according to claim 7, wherein said second circuit is in said power down condition while said power control signal is in a first state and in said power on condition while said power control signal is in a second state.

9. The apparatus according to claim 1, wherein said data bus is an address/command bus of a double data rate (DDR) memory module.

10. The apparatus according to claim 9, wherein said DDR memory module comprises a double data rate fourth generation (DDR4) dual in-line memory module (DIMM).

11. The apparatus according to claim 1, wherein said apparatus implements a registered clock driver (RCD) circuit.

12. The apparatus according to claim 11, wherein said RCD circuit is at least double data rate fourth generation (DDR4) compliant.

13. The apparatus according to claim 1, wherein said second circuit comprises a continuous-time linear equalizer (CTLE) circuit.

14. The apparatus according to claim 1, wherein said reference voltage is received by a plurality of said second circuits.

15. The apparatus according to claim 1, wherein said memory channel comprises a plurality of dynamic random access memory (DRAM) chips.

16. A method for single-ended memory signal equalization at power up, comprising the steps of:
    buffering an input signal received as a single-ended signal from a data bus connected between a memory channel and a memory controller; and
    equalizing said input signal relative to a reference voltage using a filter circuit to generate a differential signal, wherein said reference voltage is isolated from said filter circuit in response to a transition from a power down condition to a power on condition.

17. The method according to claim 16, further comprising the step of:
connecting said reference voltage to said filter circuit after a predetermined time.

18. The method according to claim 16, further comprising the step of:
alternatively isolating and connecting said reference voltage to said filter circuit in response to a power control signal.

19. The method according to claim 18, further comprising the step of:
delaying said power control signal to generate an intermediate signal, wherein alternatively isolating and connecting is controlled by said intermediate signal.

20. The method according to claim 16, wherein (i) said transition from said power down condition to said power on condition is in response to a power control signal and (ii) said filter circuit is in said power down condition while said power control signal is in a first state and in said power on condition while said power control signal is in a second state.

* * * * *